(12) United States Patent
Sasaki et al.

(10) Patent No.: US 8,957,568 B2
(45) Date of Patent: Feb. 17, 2015

(54) ELECTRONIC COMPONENT, POLYMER ACTUATOR, AND METHOD FOR MANUFACTURING ELECTRONIC COMPONENT

(75) Inventors: Yorihiko Sasaki, Miyagi-ken (JP); Teppei Sugawara, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 339 days.

(21) Appl. No.: 13/585,674

(22) Filed: Aug. 14, 2012

(65) Prior Publication Data

US 2013/0049540 A1 Feb. 28, 2013

(30) Foreign Application Priority Data

Aug. 31, 2011 (JP) ................... 2011-188213

(51) Int. Cl.
*H01L 41/053* (2006.01)
(52) U.S. Cl.
CPC .................... *H01L 41/053* (2013.01)
USPC ........................................................ 310/344
(58) Field of Classification Search
CPC ...... H02N 2/005; H02N 2/007; H01L 41/053; H01L 41/193; H01L 41/094; H01L 41/0933; H01L 41/0926

USPC ............................................ 310/330–332, 340
See application file for complete search history.

(56) References Cited

U.S. PATENT DOCUMENTS

| 4,608,509 | A  | * | 8/1986  | Yamamoto et al. | 310/357 |
| 6,111,338 | A  | * | 8/2000  | Otsuchi et al. | 310/352 |
| 6,747,392 | B1 | * | 6/2004  | Wajima et al. | 310/320 |
| 6,812,622 | B2 | * | 11/2004 | Matsuyama et al. | 310/344 |
| 7,358,652 | B2 | * | 4/2008  | Aratake et al. | 310/340 |
| 7,615,913 | B2 | * | 11/2009 | Takei et al. | 310/340 |
| 8,227,958 | B2 | * | 7/2012  | Inoue et al. | 310/344 |
| 8,334,639 | B2 | * | 12/2012 | Saita | 310/344 |

FOREIGN PATENT DOCUMENTS

JP 2008-35682 2/2008

* cited by examiner

*Primary Examiner* — J. San Martin
(74) *Attorney, Agent, or Firm* — Beyer Law Group LLP

(57) ABSTRACT

An electronic component includes an electronic component body having a plurality of electrodes and a sealing film sandwiching the electronic component body from both surfaces. The sealing film is sealed along its entire periphery. Extraction electrode portions are formed on an inner surface of the sealing film which is in contact with the electronic component body, and at positions corresponding to the electrodes, and are in contact with the electrodes.

10 Claims, 3 Drawing Sheets

ELECTRONIC COMPONENT, POLYMER ACTUATOR, AND METHOD FOR MANUFACTURING ELECTRONIC COMPONENT

CLAIM OF PRIORITY

This application claims benefit of Japanese Patent Application No. 2011-188213 filed on Aug. 31, 2011, which is hereby incorporated by reference.

BACKGROUND OF THE INVENTION

1. Field of the Invention

The present invention relates to an electronic component which is suitably used when a movable electronic component body such as a polymer actuator is cut off from the outside air.

2. Description of the Related Art

In the related art, in order to stably operate a polymer actuator in various atmospheres, an actuator having a sealing structure has been considered. An electronic component shown in FIG. 6 has a sealing film 130 which covers an actuator body 115 and electrodes 125a and 125b so as to wrap the entireties thereof, and at least portions of conductive lines 142, for applying voltages to the electrodes 125a and 125b, which portions are connected to the electrodes 125a and 125b are retained between the sealing film 130 and the actuator body 115. The sealing film 130 has performance to cut off the outside air. Metal layers 144 are provided between the sealing film 130 and the electrodes 125a and 125b or inside the sealing film 130.

The electrical connection between the conductive lines 142 and the electrodes 125a and 125b is established as follows. Prior to forming the electrodes 125a and 125b on the metal layers 144, the metal layers 144 and the conductive lines 142 whose ends are exposed are electrically connected to each other by means of a conductive adhesive 143, solder, or the like. Then, the electrodes 125a and 125b are formed so as to cover the conductive lines 142 whose ends are exposed, thereby electrically connecting the conductive lines 142 to the electrodes 125a and 125b. Next, the conductive lines 142 whose ends are exposed are substantially perpendicularly bent to come into contact with side-wall portions of the electrodes 125a and 125b, and the conductive lines 142, the side-wall portions of the electrodes 125a and 125b, and the surfaces of the metal layers 144 are coupled to each other by means of the conductive adhesive 143 to provide a structure of being fixed to the surfaces of the metal layers 144. Japanese Unexamined Patent Application Publication No. 2008-035682 is an example of the related art.

As described above, in the existing electronic component, the outside air can be cut off from the actuator body 115. However, the structure of the electronic component is complicated in order to ensure contact between the electrodes 125a and 125b and the conductive lines 142 as described.

SUMMARY OF THE INVENTION

The present invention provides an electronic component including: an electronic component body having a plurality of electrodes; and a sealing film sandwiching the electronic component body from both surfaces thereof. The sealing film is sealed along its entire periphery, and extraction electrode portions are formed on an inner surface of the sealing film which is in contact with the electronic component body, and at positions corresponding to the electrodes, and are in contact with the electrodes. Because of this, the electronic component body can easily be cut off from the outside air and electrical conduction to the electronic component can be ensured.

In addition, in the electronic component of the present invention, the electronic component body may be a polymer actuator. Because of this, the polymer actuator can easily be cut off from the outside air and the characteristics of the polymer actuator can be maintained.

In addition, in the electronic component of the present invention, the sealing film may include a resin film and a conductive sealing member sealing an opening formed in the resin film. Because of this, the extraction electrode portions can be reduced in size.

In addition, in the electronic component of the present invention, conduction may be enabled via the conductive sealing member and the extraction electrode portions from an outer surface of the sealing film to the electrodes of the electronic component body.

In addition, in the electronic component of the present invention, the electronic component body and the sealing film may be slidable relative to each other. Because of this, movement of the electronic component body is not inhibited by the sealing film.

In addition, in the electronic component of the present invention, the electrodes of the electronic component body and the extraction electrode portions may not be bonded to each other. Because of this, it is made easy to manufacture the electronic component.

Further, in the polymer actuator of the present invention, a gap may be provided inside the sealing film and on a movable portion side of the polymer actuator. Because of this, the polymer actuator is made to more easily move.

In addition, in the electronic component of the present invention, the electrodes of the electronic component body may be formed on two surfaces, respectively, of the electronic component body with which the sealing film is in contact, and the extraction electrode portions may be present on corresponding surfaces, respectively, of the sealing film. Because of this, the effective area of the electronic component can be increased.

In addition, in the electronic component of the present invention, the extraction electrode portions may be located so as to be opposed to each other. Because of this, the effective area of the electronic component can be further increased and electrical conduction and fixing can be performed by sandwiching the electronic component from above and below by connection terminals.

Furthermore, the present invention provides a method for manufacturing an electronic component. The method includes: covering an electronic component body having a plurality of electrodes with a sealing film having extraction electrode portions provided on a surface thereof, and sealing the sealing film; and enabling electrical conduction via the extraction electrode portions from another surface of the sealing film to the plurality of electrodes of the electronic component body. Because of this, an electronic component can be provided from which the outside air can easily be cut off and which ensures electrical conductivity.

DESCRIPTION OF THE PREFERRED EMBODIMENTS

Next, examples of embodiments of the present invention will be described in detail with reference to the drawings.

[First Embodiment]

Figure 1:
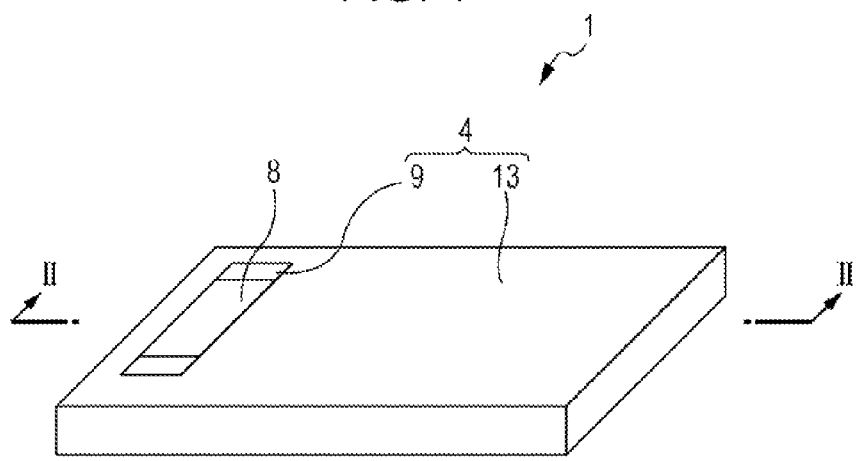
FIG. 1 is a diagram illustrating an electronic component of a first embodiment.
Figure 2:
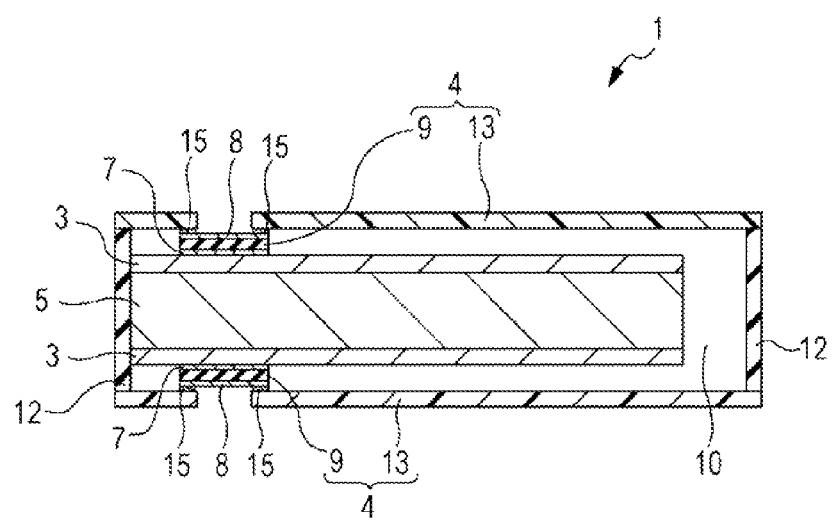
FIG. 2 is a diagram illustrating a cross section taken along the II-II line in FIG. 1.
Figure 3:
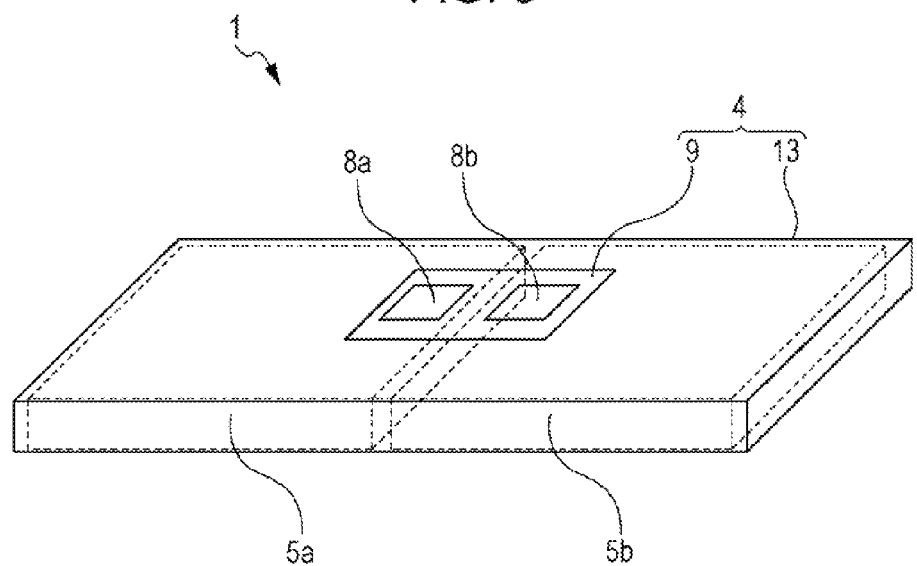
FIG. 3 is a diagram illustrating a modified example of the electronic component of the first embodiment.

FIG. 1 is a diagram illustrating an electronic component of a first embodiment of the present invention, and FIG. 2 is a diagram illustrating a cross section taken along the II-II line in FIG. 1. In addition, FIG. 3 is a diagram illustrating a modified example of the electronic component of the first embodiment.

FIG. 1 is a diagram illustrating the electronic component of the first embodiment. As shown in FIG. 1, the electronic component 1 according to the present embodiment has a sealing film 4 which includes a resin film 13 and conductive sealing members 9. The sealing film 4 is sealed along its entire periphery and sandwiches therein an electronic component body 5 (not shown) from both surfaces thereof. The resin film 13 is formed from polyethylene terephthalate (PET) having a thickness of 150 μm and has openings in each of which the conductive sealing member 9 is provided. Each conductive sealing member 9 is an insulating resin substrate having electrodes formed on both surfaces thereof and is bonded via an insulating adhesive layer so as to close the opening of the resin film 13, thereby cutting off the electronic component body 5 as a whole from the external environment. The material of the resin film 13 is not particularly limited to PET as long as permeability of gas and moisture to be sealed and flexibility for allowing for movement are ensured. A film on which metal is deposited may be used.

FIG. 2 is a diagram illustrating the cross section taken along the II-II line in FIG. 1. As shown in FIG. 2, the electronic component 1 has the electronic component body 5 and the sealing film 4 which sandwiches the electronic component body 5 from both surfaces thereof. The electronic component body 5 is a polymer actuator, and two electrodes 3 each containing a material such as carbon are respectively provided on upper and lower surfaces of the polymer actuator, namely, two surfaces of the polymer actuator with which the sealing film 4 is in contact. Meanwhile, the conductive sealing members 9 are disposed in two inner surfaces of the sealing film 4 which are in contact with the electrodes 3, and at positions corresponding to the electrodes 3, respectively, and an extraction electrode portion 7 is provided at a site of the surface of each conductive sealing member 9 which is in contact with the corresponding electrode 3. Each conductive sealing member 9 is bonded to the resin film 13 by means of an adhesive layer 15 so as to close the opening of the resin film 13. In addition, the other surface of each conductive sealing member 9 is exposed to the outside, and an external connection electrode 8 is provided thereon. The extraction electrode portion 7 and the external connection electrode 8 are electrodes formed on each conductive sealing member 9 and are desirably formed from a metal such as gold in terms of contact resistance and the like. In addition, a through hole (not shown) is provided within each conductive sealing member 9 so as to electrically connect the extraction electrode portion 7 to the external connection electrode 8, and thus the electronic component body 5 can be electrically connected to an external terminal contacting the external connection electrode 8, via the electrode 3 and the conductive sealing member 9. It is noted that the upper and lower resin films 13 are sealed by insulating sealing member 12. The insulating sealing member 12 is a member which provides sealing without conducting a plurality of the electrodes 3 to each other, and may be an adhesive layer which sticks the resin films 13 together, or if the resin film 13 has insulating properties, a turn-up portion of the resin film 13 that has been folded in the middle may be the insulating sealing member 12 or a fused portion of the resin film 13 that has been fused by ultrasonic waves or heat may be the insulating sealing member 12.

When such a structure of the electronic component 1 is provided, the electronic component body 5 can easily be cut off from the outside air and electrical conduction between the external connection electrodes 8 and the electrodes 3 of the electronic component body 5 can be ensured. When a voltage is applied to each external connection electrode 8, the polymer actuator which is the electronic component body 5 can generate a movement of bending in the vertical direction. There are kinds of polymer actuators that less move when being exposed to the outside air, but even in the case of movement in a humid or special environment, the characteristics of a polymer actuator can be maintained by cutting off the outside air. It is noted that in the present embodiment, the case has been illustrated where each conductive sealing member 9 is an insulating resin substrate and has the external connection electrode 8, but the entirety of each conductive sealing member 9 may be formed from metal foil or a metal thin plate such that the inner surface and the outer surface thereof are the extraction electrode portion 7 and the external connection electrode 8, respectively.

In addition, in the electronic component 1 of the present invention, in order to allow the electronic component body 5 and the sealing film 4 to slide relative to each other, each electrode 3 of the electronic component body 5 and the sealing film 4 are not fixed to each other by means of an adhesive or the like. Because of this, the movement of the electronic component body 5 is not inhibited, and thus the electronic component body 5 is suitably used as the polymer actuator. Furthermore, the electronic component 1 of the present invention has a gap 10 inside the sealing film 4 and on the movable portion side of the polymer actuator. Thus, the polymer actuator easily moves.

In addition, in the electronic component 1 of the present invention, each electrode 3 of the electronic component body 5 and each extraction electrode portion 7 are not bonded to each other, and each extraction electrode portion 7 is located so as to be opposed to each other. Thus, it is made easy to manufacture the electronic component 1, and the effective area of the region, in the electronic component 1, where there are no extraction electrode portions 7 can be increased. In the case where the electronic component 1 is a polymer actuator, a movable region can be widened. In addition, although not shown, when each external connection electrode 8 of the electronic component 1 is sandwiched by a connection terminal provided in an external circuit, electrical conduction between each electrode 3 of the electronic component body 5 and each extraction electrode portion 7 and fixing of the electronic component 1 can easily be performed.

FIG. 3 is a diagram illustrating the modified example of the electronic component of the first embodiment. As shown in FIG. 3, the electronic component 1 has a sealing film 4 which includes a resin film 13 and a conductive sealing member 9. The sealing film 4 is sealed along its entire periphery and sandwiches therein electronic component bodies 5a and 5b from both surfaces thereof. The conductive sealing member 9 is provided on a surface of the sealing film 4, is an insulating resin substrate, and has external connection electrodes 8a and 8b formed from a metal such as gold. The external connection electrodes 8a and 8b can be electrically conducted to electrodes (not shown) provided on surfaces of the electronic component bodies 5a and 5b via extraction electrode portions (not shown), respectively. When the external connection electrodes 8a and 8b of the electronic component 1 are pressed from the above by two connection terminals provided in an external circuit, electrical conduction to the electronic component body 5 and fixing of the electronic component 1 are easily performed, and it is made possible to independently energize and move the electronic component bodies 5a and 5b. It is noted that in the present embodiment, the case has been illustrated where the number of the external connection electrodes 8 is two, but the number is not limited thereto and there may be more external connection electrodes 8.

Next, a method for manufacturing the electronic component 1 according to the present embodiment will be described.

First, the electronic component body 5 (see FIG. 2) having a plurality of the electrodes 3 is covered with the sealing film 4 in which the extraction electrode portions 7 are provided on the inner surface. The sealing film 4 has a rectangular shape when been seen in a top view, and is formed in the shape of a bag in which three sides are sealed by the insulating sealing member 12. In addition, the resin film 13, which is a portion of the sealing film 4, has two openings at positions corresponding to the two extraction electrode portions 7, and the respective conductive sealing members 9 are fixed by the adhesive layer 15 so as to seal the openings. In addition, each conductive sealing member 9 has the external connection electrode 8 which is electrically connected to the extraction electrode portion 7.

Next, the sealing film 4 is depressurized and evacuated while adjusting the position of the sealing film 4. The depressurization and evacuation is performed from one side of the rectangle of the bag-shaped sealing film 4 while position adjustment is performed such that a plurality of the electrodes 3 of the electronic component body 5 and the extraction electrode portions 7 provided in the sealing film 4 can be in contact with each other. Due to the depressurization and evacuation, the inner surface of the sealing film 4 comes into contact with the electronic component body 5 in a manner to sandwich the electronic component body 5 from both surfaces thereof, to such an extent as not to prevent movement of the electronic component body 5.

Next, sealing of the sealing film 4 is performed. The side of the rectangle of the bag-shaped sealing film 4 is sealed by means of adhesion of the insulating sealing member 12, thermocompression bonding, or the like, while depressurization and evacuation is performed. It is noted that the sealing film 4 may be sealed along the entire periphery of the electronic component body 5 by means of thermocompression bonding according to need.

At the end, an unnecessary portion of the sealing film 4 is cut. Through the above processes, the electronic component 1 can be provided from which the outside air can easily be cut off and which ensures electrical conductivity. It is noted that in the present embodiment, the case has been illustrated where the resin film 13 and each extraction electrode portion 7 are fixed to each other by the adhesive layer 15, but the resin film 13 and each extraction electrode portion 7 may be integrated with each other.

[Second Embodiment]

Figure 4:
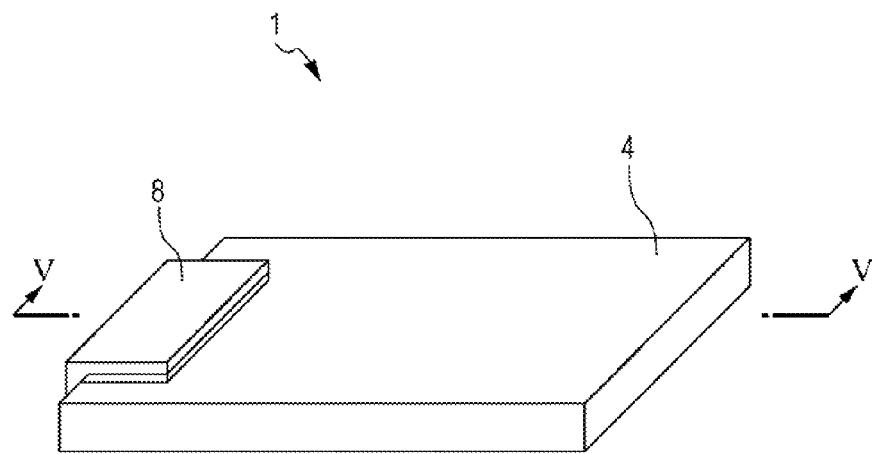
FIG. 4 is a diagram illustrating an electronic component of a second embodiment.

Next, an example of another embodiment of the present invention will be described. FIG. 4 is a diagram illustrating an electronic component of the other embodiment of the present invention, and FIG. 5 a diagram illustrating a cross section taken along the V-V line in FIG. 4.

FIG. 4 is a diagram illustrating the electronic component of the other embodiment of the present invention. As shown in FIG. 4, the electronic component 1 according to the present embodiment has a sealing film 4 and external connection electrodes 8. Although not shown, the sealing film 4 sandwiches an electronic component body 5 having a plurality of electrodes 3 from both surfaces thereof. In addition, the sealing film 4 is formed from polyethylene terephthalate (PET) having a thickness of 150 μm and is sealed along its entire periphery. Each external connection electrode 8 is provided on a surface of the sealing film 4 and is formed from a metal such as gold. Although not shown, the external connection electrodes 8 can be electrically conducted to the plurality of electrodes 3.

Figure 5:
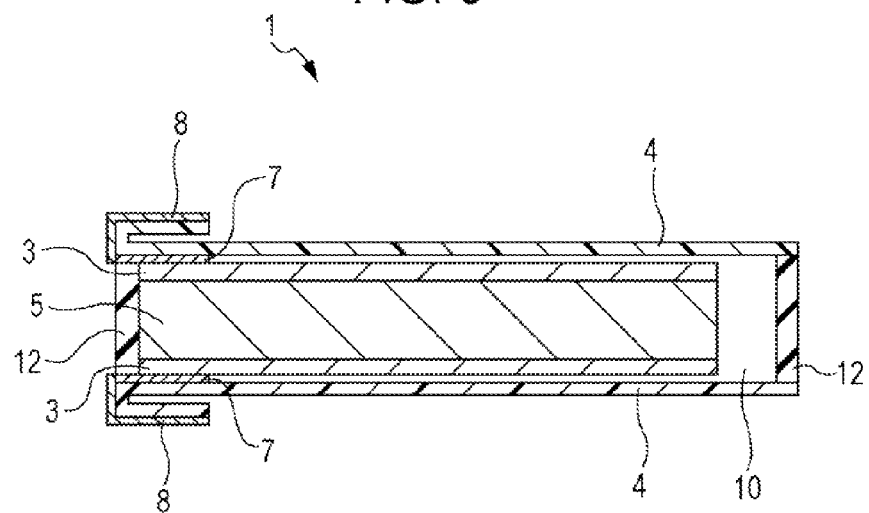
FIG. 5 is a diagram illustrating a cross section taken along the V-V line in FIG. 4.
Figure 6:
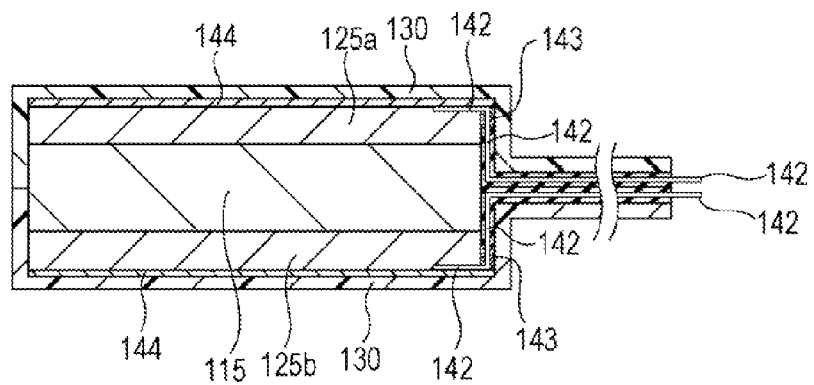
FIG. 6 is a diagram illustrating an existing electronic component.

FIG. 5 is a diagram illustrating the cross section taken along the V-V line in FIG. 4. As shown in FIG. 5, the electronic component 1 has the electronic component body 5 and the sealing film 4 which sandwiches the electronic component body 5 from both surfaces thereof. The electronic component body 5 is a polymer actuator, and the two electrodes 3 each containing a material such as carbon are provided on upper and lower surfaces of the polymer actuator, namely, two surfaces of the polymer actuator with which the sealing film 4 is in contact. Meanwhile, two extraction electrode portions 7 are formed on two inner surfaces of the sealing film 4 which are in contact with the electrodes 3 of the electronic component body 5, and at positions corresponding to the respective electrodes 3, and are in contact with the respective electrodes 3. Each extraction electrode portion 7 is formed from a metal such as gold. In addition, the external connection electrodes 8 are provided on the sealing film 4 and are fixed and electrically connected to the respective extraction electrode portions 7 by means of a conductive adhesive or the like.

In addition, the sealing film 4 of the electronic component 1 of the present invention has a rectangular shape when been seen in a top view, and is formed in the shape of a bag in which one side of the rectangle is opened. At an opening of the bag-shaped sealing film 4, namely, at the side of the rectangle, the external connection electrodes 8, the extraction electrode portions 7, and an insulating sealing member 12 is provided as shown in FIG. 5, and another opposing side is sealed by an insulating sealing member 12. The insulating sealing member 12 at the opening is formed from an insulating material such as resin and is fixed to the sealing film 4 and the extraction electrode portions 7 by means of an adhesive or the like so as to seal the opening of the sealing film 4.

When such a structure of the electronic component 1 is provided, the outside air can easily be cut off and electrical conduction between each external connection electrode 8 and each electrode 3 of the electronic component body 5 can be ensured. When a voltage is applied to each external connection electrode 8, the polymer actuator, which is the electronic component body 5, can generate a movement of bending in the vertical direction. In addition, each external connection electrode 8 has flexibility, and when each external connection electrode 8 of the electronic component 1 is sandwiched by a connection terminal provided in an external circuit, electrical conduction between each electrode 3 of the electronic component body 5 and each extraction electrode portion 7 and fixing of the electronic component 1 can easily be performed, although not shown. It is noted that in the present embodiment, the case has been illustrated where each external connection electrode 8 and each extraction electrode portion 7 are fixed to each other by means of a conductive adhesive or the like, but each external connection electrode 8 and each extraction electrode portion 7 may be integrated with each other.

What is claimed is:

1. An electronic component comprising:
   an electronic component body having a plurality of electrodes formed thereon; and
   a pair of sealing films facing each other with the electronic component body interposed therebetween, the pair of sealing films being sealed along an entire periphery thereof,
   wherein the sealing films include extraction electrode portions provided on inner surfaces thereof at positions corresponding to the electrodes, the extraction electrode portions being in contact with the corresponding electrodes,
   and wherein the sealing films have an opening formed thereon, the sealing films further comprising a conductive sealing member sealing the opening.

2. The electronic component according to claim 1, wherein the electronic component body has a movable portion.

3. The electronic component according to claim 2, wherein the electronic component body is a polymer actuator.

4. The electronic component according to claim 3, wherein a space is provided between the sealing films on a movable portion side of the polymer actuator.

5. The electronic component according to claim 1, wherein the electronic component body and the sealing films are slidable relative to each other.

6. The electronic component according to claim 1, wherein the extraction electrode portions and the corresponding electrodes of the electronic component are not bonded to each other.

7. The electronic component according to claim 1, wherein the electronic component body has the electrodes on two surfaces thereof facing the respective inner surfaces of the sealing films.

8. The electronic component according to claim 7, wherein the extraction electrode portions face each other with the electronic component body interposed therebetween.

9. The electronic component according to claim 1, wherein the sealing films are in contact with the electronic component body via the extract electrode potions thereof.

10. A electronic component comprising:
    an electronic component body having a plurality of electrodes formed thereon and a movable portion, the electronic component body being a polymer actuator; and
    a pair of sealing films facing each other with the electronic component body interposed therebetween, the pair of sealing films being sealed along an entire periphery thereof,
    wherein the sealing films include:
      extraction electrode portions provided on inner surfaces thereof at positions corresponding to the electrodes, the extraction electrode portions being in contact with the corresponding electrodes;
      a resin film portion having an opening formed thereon; and
      a conductive sealing member sealing the opening.

\* \* \* \* \*